United States Patent
Weng et al.

(10) Patent No.: US 9,940,983 B2
(45) Date of Patent: *Apr. 10, 2018

(54) CHANNEL CONTROLLING DEVICE FOR IMPROVING DATA READING EFFICIENCY

(71) Applicant: Silicon Motion Inc., Hsinchu County (TW)

(72) Inventors: Chen-Yu Weng, Kaohsiung (TW); Wen-Kai Liu, Hsinchu County (TW)

(73) Assignee: Silicon Motion Inc., Hsinchu County (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/605,914

(22) Filed: May 25, 2017

(65) Prior Publication Data
US 2017/0270980 A1  Sep. 21, 2017

Related U.S. Application Data

(63) Continuation of application No. 15/252,227, filed on Aug. 31, 2016, now Pat. No. 9,704,543.

(51) Int. Cl.
G11C 7/00 (2006.01)
G11C 7/10 (2006.01)

(52) U.S. Cl.
CPC .......... *G11C 7/1012* (2013.01); *G11C 7/1051* (2013.01); *G11C 7/1066* (2013.01); *G11C 7/1072* (2013.01); *G11C 2207/2281* (2013.01)

(58) Field of Classification Search
CPC ... G11C 7/1012; G11C 7/1006; G11C 7/1051; G11C 7/1078
USPC .......................... 365/189.02, 189.15, 189.17
See application file for complete search history.

(56) References Cited

U.S. PATENT DOCUMENTS

| 7,496,695 | B2 | 2/2009 | Go et al. |
| 9,704,543 | B2 * | 7/2017 | Weng ................... G11C 7/1012 |
| 2012/0072677 | A1 | 3/2012 | Biswas |
| 2012/0263003 | A1 | 10/2012 | Sakakibara |
| 2013/0100750 | A1 * | 4/2013 | Ishiguro ............. H03K 19/1776 365/189.011 |
| 2014/0201471 | A1 | 7/2014 | Cutter |

FOREIGN PATENT DOCUMENTS

| TW | 200841351 | 10/2008 |
| TW | I420316 | 12/2013 |

* cited by examiner

*Primary Examiner* — Son Dinh
(74) *Attorney, Agent, or Firm* — Winston Hsu (57) ABSTRACT

A channel controlling device includes: a multiplexing circuit coupled to multiple channels for selecting a particular channel from the channels to output a channel data according to a selection signal, wherein the channels correspond to multiple predetermined digital numbers; a sorting circuit arranged to sort the predetermined digital numbers to form multiple sorted digital numbers according to a data output order of the channels; and an arbitration circuit, arranged to determine the selection signal according to the plurality of sorted digital numbers.

19 Claims, 6 Drawing Sheets

CHANNEL CONTROLLING DEVICE FOR IMPROVING DATA READING EFFICIENCY

CROSS REFERENCE TO RELATED APPLICATIONS

This application is a continuation application and claims the benefit of U.S. Non-provisional Application No. 15/252,227, which was filed on Aug. 31, 2016, and is included herein by reference. The U.S. Non-provisional Application No. 15/252,227 claims the benefit of Taiwan Non-provisional Application No. 104129265, which was filed on Sep. 4, 2015.

BACKGROUND OF THE INVENTION

1. Field of the Invention

The present invention relates to a channel controlling device, and more particularly to a storage device control circuit capable of adjusting the data output order of a plurality of channels.

2. Description of the Prior Art

Developments in technology for storage devices have increased their data storage amount, thereby increasing the difficulty of reading data stored in the storage device. A plurality of data channels is utilized to increase the read speed of a flash memory, wherein the data read from the flash memory is decoded in advance, and then sent to a host. The decoder of the flash memory cannot receive data from multiple channels at the same time. An arbitration circuit is therefore utilized to determine an output order of multiple channels so the channels can be controlled to output data to the decoder according to the output order. The output order needs to be dynamically adjustable, however. For example, when the current output order is incorrect, the arbitration circuit should be capable of instantly correcting the output order. Hence, how to provide a storage device control circuit that can dynamically adjust the channel output data order is an issue to be solved in this field.

SUMMARY OF THE INVENTION

An objective of the present invention is to provide a storage device control circuit capable of adjusting the data output order of multiple channels. An embodiment of the present invention provides a channel controlling device. The channel controlling device comprises a multiplexing circuit, a sorting circuit and an arbitration circuit. The multiplexing circuit is coupled to multiple channels, and is arranged to refer to a selection signal to select a particular channel from the channels to output a channel data selection signal, wherein the channels are corresponding to multiple predetermined digital numbers, respectively. The sorting circuit is arranged to refer to a data output order of the channels to sort the predetermined digital numbers, in order to convert the predetermined digital numbers into multiple sorted digital numbers. The arbitration circuit is arranged to refer to the sorted digital numbers to determine the selection signal.

These and other objectives of the present invention will no doubt become obvious to those of ordinary skill in the art after reading the following detailed description of the preferred embodiment that is illustrated in the various figures and drawings.

DETAILED DESCRIPTION

Some phrases in the present specification and claims refer to specific elements; however, please note that the manufacturer might use different terms to refer to the same elements. Further, in the present specification and claims, the term "comprising" is open type and should not be viewed as the term "consists of." The term "electrically coupled" can refer to either direct connection or indirect connection between elements. Thus, if the specification describes that a first device is electrically coupled to a second device, the first device can be directly connected to the second device, or indirectly connected to the second device through other devices or means.

Figure 1:
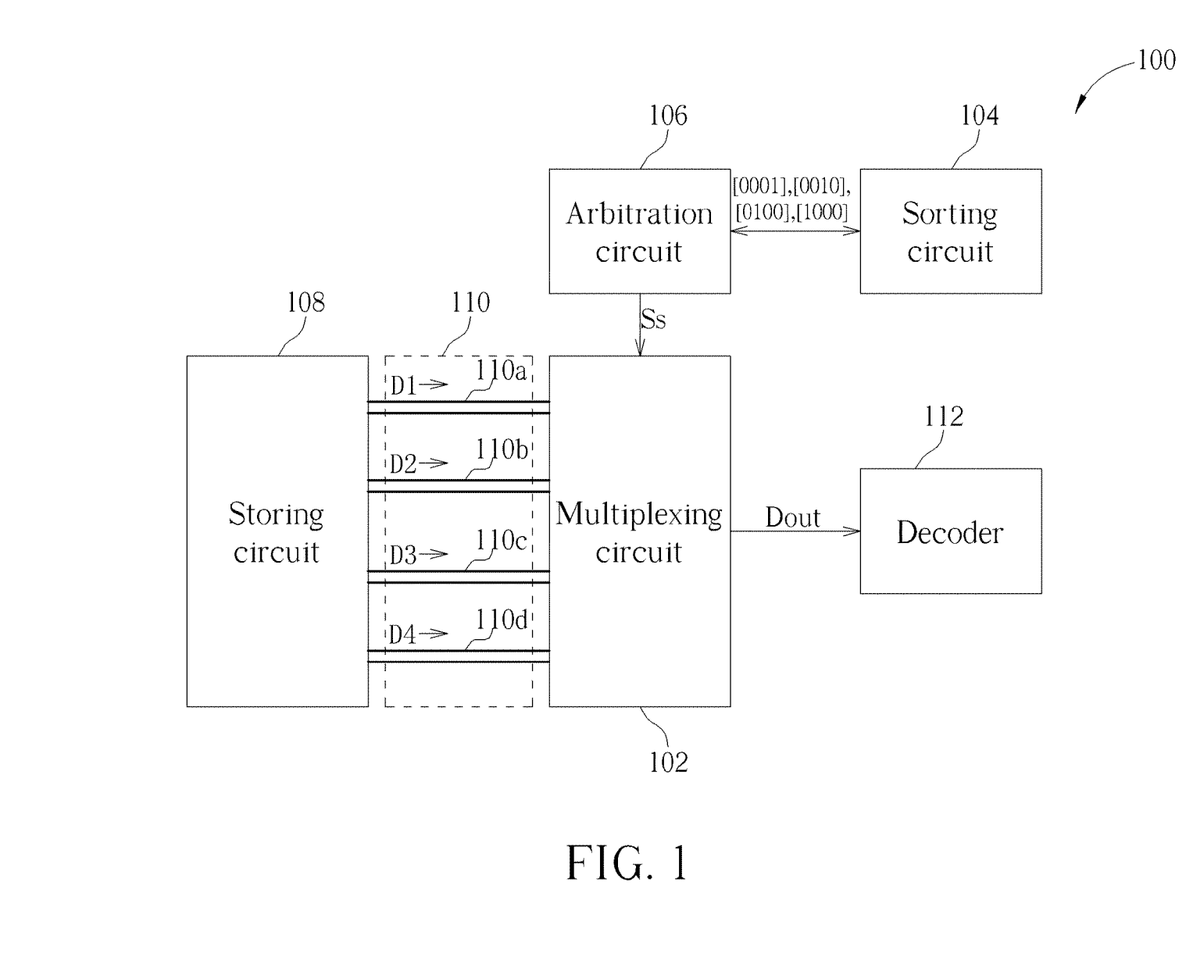
FIG. 1 is a diagram illustrating a channel controlling device according to an embodiment of the present invention.

FIG. 1 is a diagram illustrating a channel controlling device 100 according to an embodiment of the present invention. The channel controlling device 100 comprises the multiplexing circuit 102, a sorting circuit 104 and an arbitration circuit 106. In this embodiment, the channel controlling device 100 may be viewed as a plurality of channel controlling devices of a storing circuit. For better understanding of the operations of the channel controlling device 100 in this embodiment, FIG. 1 further shows a storing circuit 108 and a plurality of channels 110, wherein the channels 110 are coupled to the storing circuit 108, and the channels 110 are arranged to transmit/receive data of the storing circuit 108. The multiplexing circuit 102 is coupled to the channels 110, and arranged to refer to the selecting signal S for selecting a channel from the channels 110, in order to output a channel data Dout. The channels 110 correspond to a plurality of predetermined digital numbers, respectively. The sorting circuit 104 refers to the data output order of the channels 110 to queue the predetermined digital numbers, in order to form a plurality of queued digital numbers. The arbitration circuit 106 refers to the queued digital numbers to determine the selecting signal S. The channel data Dout is then transmitted to a decoder 112, and the decoded data outputted by the decoder 112 is transmitted to a host (not shown).

For better understanding, the channels 110 are assumed to comprise four channels 110a, 110b, 110c and 110d, but the present invention is not limited thereto, and the channels 110 may comprise more than four channels. Further, the channels 110a, 110b, 110c and 110d are represented by the predetermined digital numbers [0001], [0010], [0100] and [1000], respectively, wherein each predetermined digital number has four bits, wherein one bit amongst the four is 1, and the others are 0. For example, in the first predetermined digital number [0001] corresponding to the first channel 110*a*, the least significant bit (LSB) is 1, and the remaining higher significant bits are 0. In the second predetermined digital number [0010] corresponding to the second channel 110*b*, the least significant bit is 0, the second least significant bit is 1, and the remaining higher significant bits are 0. In the third predetermined digital number corresponding to the third channel 110*c*, the least significant bit and the second least significant bit are 0, the third least significant bit is 1, and the most significant bit (MSB) is 0. In the fourth predetermined digital number [1000] corresponding to the third channel 110*d*, the most significant bit is 1 and the remaining less significant bits are 0. Similarly, if the storing circuit 108 has five channels, each channel will be represented by five bits, wherein one bit within the five bits is 1, and the other bits are 0. In the present invention, the number of bits for presenting the predetermined digital number of each channel is equal to the channel number.

The sorting circuit 104 may further comprise a plurality of storing circuits 104*a*, 104*b*, 104*c* and 104*d*, wherein the storing circuits 104*a*, 104*b*, 104*c* and 104*d* refer to the data output order of the channels 110*a*, 110*b*, 110*c* and 110*d* for writing the predetermined digital numbers [0001], [0010], [0100] and [1000], respectively, to form the queued digital numbers. The number of the storing circuits 104*a*, 104*b*, 104*c* and 104*d* is equal to the number of the channels 110*a*, 110*b*, 110*c* and 110*d* in this embodiment.

Figure 2:
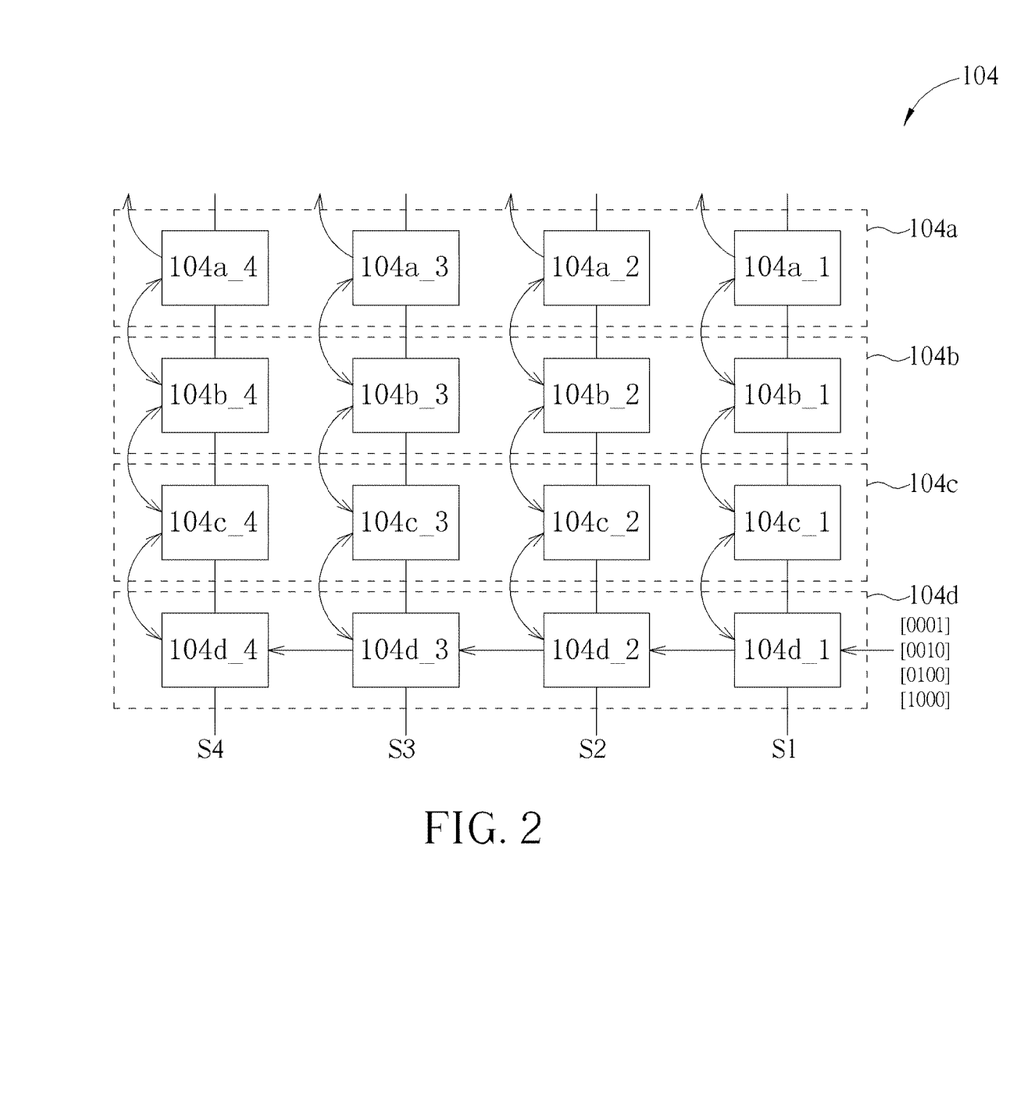
FIG. 2 is a diagram illustrating a sorting circuit according to an embodiment of the present invention.

FIG. 2 is a diagram illustrating a sorting circuit 104 according to an embodiment of the present invention. The sorting circuit 104 comprises four storing circuits 104*a*, 104*b*, 104*c* and 104*d*, each comprising a plurality of storage units, and the storing circuits 104*a*, 104*b*, 104*c* and 104*d* are arranged to store the bit values of a predetermined digital number. More specifically, in this embodiment, each storing circuit comprises four storage units, and each storage unit is arranged to store a bit value of a predetermined digital number. The number of storage units in each storing circuit is equal to the number of bits of the predetermined digital number. In this embodiment, the first storing circuit 104*a* comprises four storage units 104*a*_1, 104*a*_2, 104*a*_3 and 104*a*_4, the second storing circuit 104*b* comprises four storage units 104*b*_1, 104*b*_2, 104*b*_3 and 104*b*_4, the third storing circuit 104*c* comprises four storage units 104*c*_1, 104*c*_2, 104*c*_3 and 104*c*_4, and the fourth storing circuit 104*d* comprises four storage units 104*d*_1, 104*d*_2, 104*d*_3 and 104*d*_4. When the storage units 104*a*_1, 104*a*_2, 104*a*_3 and 104*a*_4 of the first storing circuit 104*a* store the first predetermined digital number [0001], the first storage unit 104*a*_1 is arranged to store the least significant bit [1] within [0001], the second storage unit 104*a*_2 is arranged to store the second least significant bit [0] within [0001], the third storage unit 104*a*_3 is arranged to store the third least significant bit [0] within [0001], and the fourth storage unit 104*a*_2 is arranged to store the most significant bit [0] within the predetermined digital number [0001]. Further, each of the storing circuits 104*a*, 104*b*, 104*c* and 104*d* can be used to store any of the predetermined digital numbers [0001], [0010], [0100] and [1000].

The storing circuits 104*a*, 104*b*, 104*c* and 104*d* in this embodiment are arranged in a matrix as shown in FIG. 2, wherein the first storing circuit 104*a* corresponds to a highest data output order, the second storing circuit 104*b* corresponds to a second highest data output order, the third storing circuit 104*c* corresponds to a third highest data output order, and the fourth storing circuit 104*d* corresponds to a lowest data output order. The first storing circuit 104*a* is arranged to write the predetermined digital number of a channel corresponding to a highest data output order, the second storing circuit 104*b* is arranged to write the predetermined digital number of a channel corresponding to a second highest data output order, the third storing circuit 104*c* is arranged to write the predetermined digital number of a channel corresponding to a third highest data output order, and the fourth storing circuit 104*d* is arranged to write the predetermined digital number of a channel corresponding to a lowest highest data output order. The arbitration circuit 106 reads the predetermined digital number (i.e. the predetermined digital number of the channel with the highest data output order) in the first storing circuit 104*a* to generate the selecting signal S, to make the channel with the highest data output order output the data thereof, i.e. the channel data D1, D2, D3 and D4 in the channels 110*a*, 110*b*, 110*c* and 110*d*.

The storing circuits 104*a*, 104*b*, 104*c* and 104*d* in this embodiment are further controlled by four eliminating signals S1, S2, S3 and S4, wherein the first eliminating signal S1 is coupled to the first storage unit 104*a*_1, the first storage unit 104*b*_1, the first storage unit 104*c*_1 and the first storage unit 104*d*_1; the second eliminating signal S2 is coupled to the second storage unit 104*a*_2, the second storage unit 104*b*_2, the second storage unit 104*c*_2 and the second storage unit 104*d*_2; the third eliminating signal S3 is coupled to the third storage unit 104*a*_3, the third storage unit 104*b*_3, the third storage unit 104*c*_3 and the third storage unit 104*d*_3; and the fourth eliminating signal S4 is coupled to the fourth storage unit 104*a*_4, the fourth storage unit 104*b*_4, the fourth storage unit 104*c*_4 and the fourth storage unit 104*d*_4. The first eliminating signal S1 is arranged to set the bit values in the first storage unit 104*a*_1, the first storage unit 104*b*_1, the first storage unit 104*c*_1 and the first storage unit 104*d*_1 to zero. The second eliminating signal S2 is arranged to set the bit values in the second storage unit 104*a*_2, the second storage unit 104*b*_2, the second storage unit 104*c*_2 and the second storage unit 104*d*_2 to zero. The third eliminating signal S3 is arranged to set the bit values in the third storage unit 104*a* 3, the third storage unit 104*b*_3, the third storage unit 104*c*_3 and the third storage unit 104*d*_3 to zero. The fourth eliminating signal S4 is arranged to set the bit values in the fourth storage unit 104*a*_4, the fourth storage unit 104*b*_4, the fourth storage unit 104*c*_4 and the fourth storage unit 104*d*_4 to zero.

Note that, in this embodiment, each of the storing circuits 104*a*, 104*b*, 104*c* and 104*d* may be implemented with a flip-flop, but the present invention is not limited thereto.

Referring to FIG. 2, when the arbitration circuit 106 writes the predetermined digital numbers [0001], [0010], [0100] and [1000] to the storing circuits 104*a*, 104*b*, 104*c* and 104*d* according to the data output order of the channels 110, the writing order starts from the fourth storing circuit 104*d* to the storing circuit 104*a*. Initially, the arbitration circuit 106 writes a first priority digital number (e.g. [1000]) corresponding to the channel having the highest data output order. After the first priority digital number is written to the fourth storing circuit 104*d*, the first priority digital number is transferred to the third storing circuit 104*c*. Then, the arbitration circuit 106 writes a second priority digital number (e.g. ([0010]) corresponding to the channel having the second highest order to the fourth storing circuit 104*d*. After the second priority digital number is written to the fourth storing circuit 104*d*, the first priority digital number is transferred to the second storing circuit 104*b*, and the second priority digital number is transferred to the third storing circuit 104*c*. Then, the arbitration circuit 106 writes a third priority digital number (e.g. [0100]) corresponding to the channel having the third highest data output order to the fourth storing circuit 104d. After the third priority digital number is written to the fourth storing circuit 104d, the first priority digital number is transferred to the first storing circuit 104a, the second priority digital number is transferred to the second storing circuit 104b, and the third priority digital number is transferred to the third storing circuit 104c. Then, the arbitration circuit 106 writes a fourth priority digital number (e.g. [0001]) corresponding to the channel having the lowest data output order to the fourth storing circuit 104d. In this way, the arbitration circuit 106 may refer to the data output order of the channels 110 to write the predetermined digital numbers [0001], [0010], [0100] and [1000] to the storing circuits 104a, 104b, 104c and 104d. In this embodiment, the sequential order of the queued digital numbers is [1000], [0010], [0100] and ([0001]).

Figure 3:
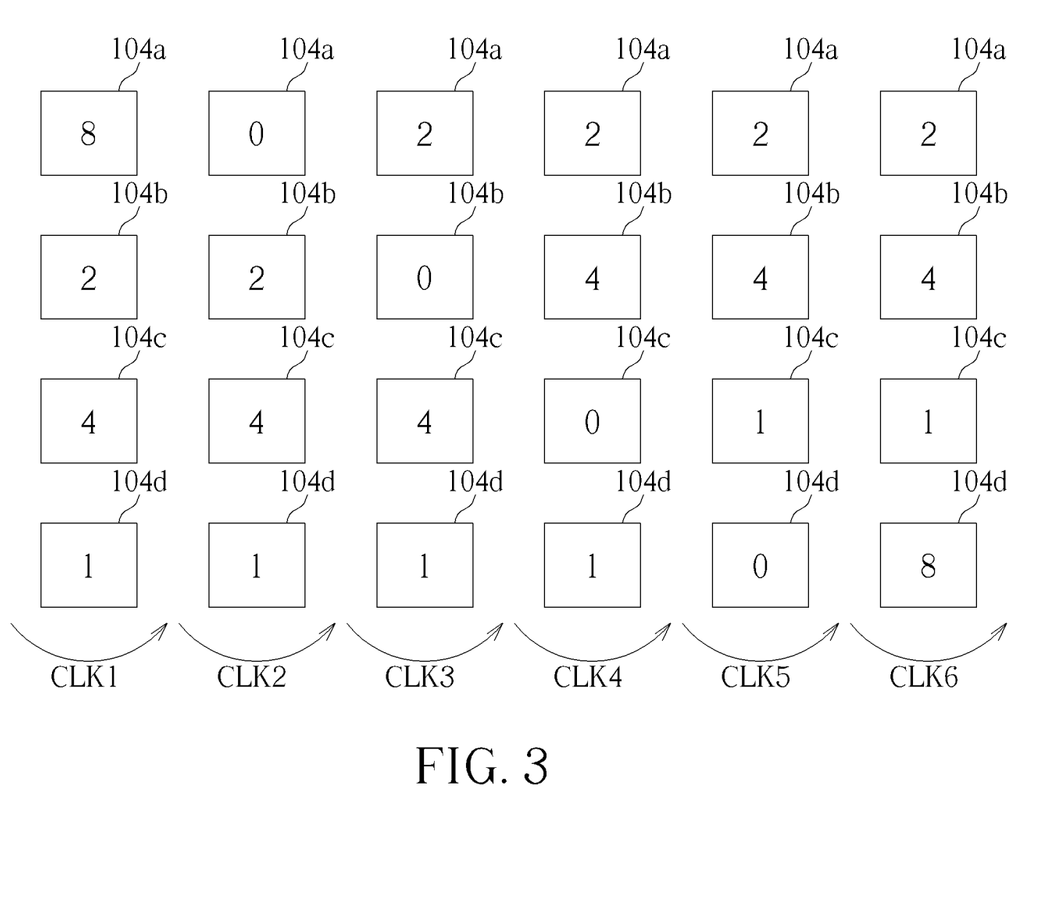
FIG. 3 is a diagram illustrating the change of a plurality of predetermined digital numbers stored in a plurality of storing circuits according to a first embodiment of the present invention.

Next, the arbitration circuit 106 reads the first priority digital number [1000] in the first storing circuit 104a to generate the selecting signal S for controlling the multiplexing circuit 102 to output the channel data D4 of the fourth channel 110d. FIG. 3 is a diagram illustrating the change of a plurality of predetermined digital numbers stored in the storing circuits 104a, 104b, 104c and 104d according to a first embodiment of the present invention. For better understanding, the binary digital numbers [1000], [0010], [0100] and [0001] stored in the storing circuits 104a, 104b, 104c and 104d (shown in FIG. 3) are represented by the decimal values 8, 2, 4 and 1, respectively. In the first period CLK1, the arbitration circuit 106 reads the digital number [1000] in the first storing circuit 104a to generate the selecting signal S for controlling the multiplexing circuit 102 to output the channel data D4 of the fourth channel 110d as the channel data Dout. In the second period CLK2, if the transmission of the channel data D4 in the fourth channel 110d is completed, the digital number [1000] in the first storing circuit 104a will be set to zero, (i.e. [0000]). Then, during the third period CLK3, the digital number [0010] previously stored in the second storing circuit 104b is transferred to the first storing circuit 104a, and the digital number [0010] is set to zero. Further, the arbitration circuit 106 will read the digital number [0010] in the first storing circuit 104a to generate the selecting signal S for controlling the multiplexing circuit 102 to the channel data D2 output of the second channel 110b as the channel data Dout. Similarly, during the fourth period CALK and the fifth period CALK, the digital number [0100] previously stored in the third storing circuit 104c and the digital number [0001] previously stored in the fourth storing circuit 104d can be transferred to the second storing circuit 104b and the third storing circuit 104c. During the fifth period CALK, the digital number of the fourth storing circuit 104d is set to zero. Then, during the sixth period CLK6, the arbitration circuit 106 writes the digital number [1000] corresponding to the fourth channel 110d to the fourth storing circuit 104d. In this embodiment, during the third period CLK3 to the sixth period CLK6, the arbitration circuit 106 continuously reads the digital number [0010] in the first storing circuit 104a to control the multiplexing circuit 102 to output the channel data D2 of the second channel 110b as the channel data Dout.

After the channel data D4 queued to the fourth channel 110d having the first priority is read during the first period CLK1, the digital number [1000] of the fourth channel 110d will be rewritten to the fourth storing circuit 104d having the lowest priority during the sixth period CLK6. The sorting circuit 104 of the present invention may effectively output the channel data D1, D2, D3 and D4 in the channels 110a, 110b, 110c and 110d according to a predetermined data output order.

In another example, after the arbitration circuit 106 refers to another data output order to write the predetermined digital numbers [0010], [0001], [0100] and [1000] to the storing circuits 104a, 104b, 104c and 104d, if a signal from a host (not shown in the figure) indicates that errors occur in the aforementioned data output order, the sorting circuit 104 of the present invention may instantly delete any predetermined digital number in the storing circuits 104a, 104b, 104c and 104d.

Figure 4:
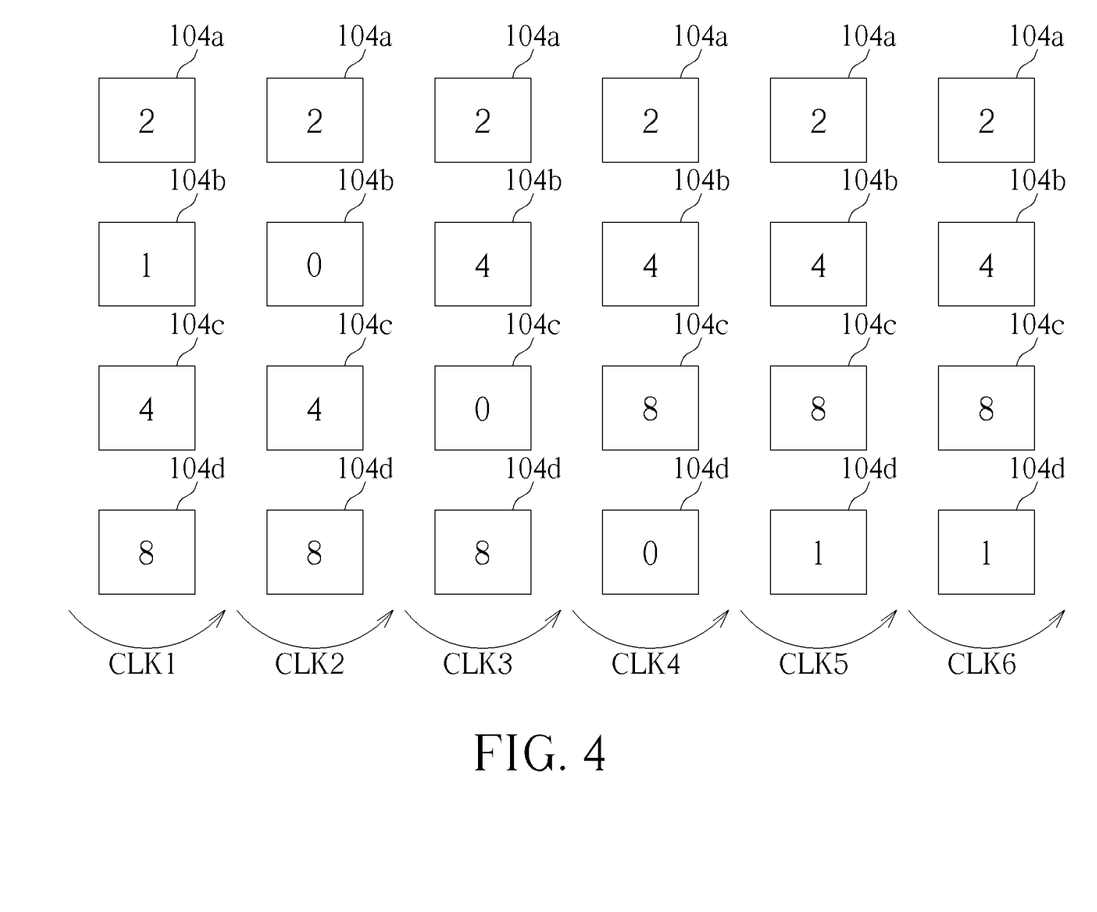
FIG. 4 is a diagram illustrating the change of a plurality of predetermined digital numbers stored in a plurality of storing circuits according to a second embodiment of the present invention.

FIG. 4 is a diagram illustrating the change of a plurality of predetermined digital numbers stored in the storing circuits 104a, 104b, 104c and 104d according to a second embodiment of the present invention. For better understanding, the binary digital numbers [0010], [0001], [0100] and [1000] stored in the storing circuits 104a, 104b, 104c and 104d shown in FIG. 4 are represented by the decimal values 2, 1, 4, 8. For example, in the second period CLK2, when a signal from a host (not shown) indicates that errors occur in the digital number [0001] stored in the second storing circuit 104b, the host will directly utilize the first eliminating signal S1 previously described in FIG. 2 to set the bit values stored in the first storage unit 104b_1 of the second storing circuit 104b to zero, i.e. by switching the bits 1 previously stored in the first storage unit 104b_1 to 0.

Through utilizing the method proposed in FIG. 4 of the present invention, in the third period CLK3 and fourth period CLK4, the digital number [0100] previously stored in the third storing circuit 104c can be transferred to the second storing circuit 104b, and the digital number [1000] previously stored in the fourth storing circuit 104d can be transferred to the third storing circuit 104c. In the fourth period CLK4, the digital number of the fourth storing circuit 104d is set to zero. In the fifth period CLK5, the arbitration circuit 106 writes the digital number [0001] corresponding to the first channel 110a to the fourth storing circuit 104d. In this embodiment, during the first period CLK1 to the sixth period CLK6, the arbitration circuit 106 keeps reading the digital number [0010] in the first storing circuit 104a to control the multiplexing circuit 102 to output the channel data D2 of the second channel 110b as the channel data Dout. In other words, the arbitration circuit 106 may read the digital number in the first storing circuit 104a to output the channel data, while the sorting circuit 104 removes the digital number stored in the storing circuit 104b (or 104c, 104d), Compared with related arts, the channel controlling device 100 of the present invention has higher data reading efficiency.

Figure 5:
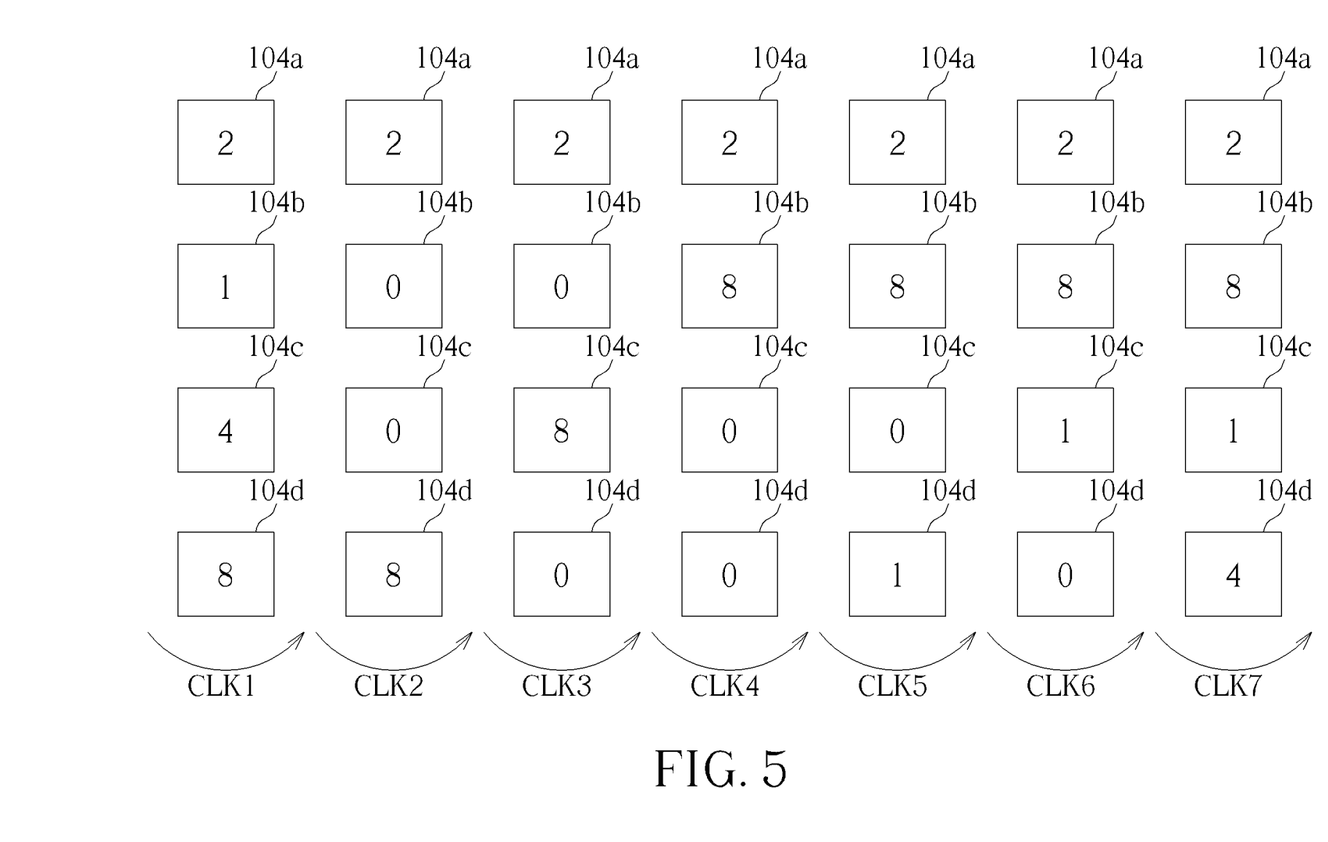
FIG. 5 is a diagram illustrating the change of a plurality of predetermined digital numbers stored in a plurality of storing circuits according to a third embodiment of the present invention.

In another example, after the arbitration circuit 106 refers to the data output order to write the predetermined digital numbers [0010], [0001], [0100] and [1000] to the storing circuits 104a, 104b, 104c and 104d, if a signal from a host (not shown) indicates that errors occur in two or more digital numbers in the sorting circuit 104, the sorting circuit 104 can instantly remove the digital numbers in multiple storing circuits. FIG. 5 is a diagram illustrating the change of a plurality of predetermined digital numbers stored in the storing circuits 104a, 104b, 104c and 104d according to a third embodiment of the present invention. For better understanding, the binary digital numbers [0010], [0001], [0100] and [1000] stored in the storing circuits 104a, 104b, 104c and 104d, respectively, are represented by decimal values 2, 1, 4, 8. For example, in the second period CLK2, when a signal from a host (not shown) indicates that errors occur in the digital numbers [0001] and [0100] stored in the second storing circuit 104b and the third storing circuit 104c, the host will directly utilize the first eliminating signal S1 and the third eliminating signal S3 shown in FIG. 2 to set the bit values stored in the first storage unit 104b_1 of the second storing circuit 104b and the third storage unit 104c_3 of the third storing circuit 104c to zero, i.e. by switching the bits 1 stored in the first storage unit 104b_1 and third storage unit 104c_3 to 0.

By utilizing the method provided by FIG. 5, in the third period CLK3, the digital number [1000] previously stored in the fourth storing circuit 104d is transferred to the third storing circuit 104c. At this time (during the third period CLK3), the digital number of the second storing circuit 104b is 0, and the digital number in the fourth storing circuit 104d will be set to 0. In the fourth period CLK4, the digital number [1000] stored in the third storing circuit 104c is transferred to the second storing circuit 104b, and the digital number stored in the third storing circuit 104c is set to 0. In the fifth period CLK5, the arbitration circuit 106 writes the digital number [0001] corresponding to the first channel 110a to the fourth storing circuit 104d. In the sixth period CLK6, the digital number
stored in the fourth storing circuit 104d is transferred to the second storing circuit 104b, and the digital number stored in the fourth storing circuit 104d is set to zero. In the period CLK7, the arbitration circuit 106 writes the digital number [0100] corresponding to the third channel 110c to the fourth storing circuit 104d. In this embodiment, during the first period CLK1 to the sixth period CLK7, the arbitration circuit 106 continuously reads the digital number [0010] in the first storing circuit 104a to control the multiplexing circuit 102 to output the channel data D2 of the second channel 110b as the channel data Dout. The arbitration circuit 106 may read the digital number in the first storing circuit 104a to output the channel data, while the sorting circuit 104 removes the digital numbers stored in the storing circuits 104b and 104c (or 104d). Compared with related arts, the channel controlling device 100 of the present invention has higher data reading efficiency.

Figure 6:
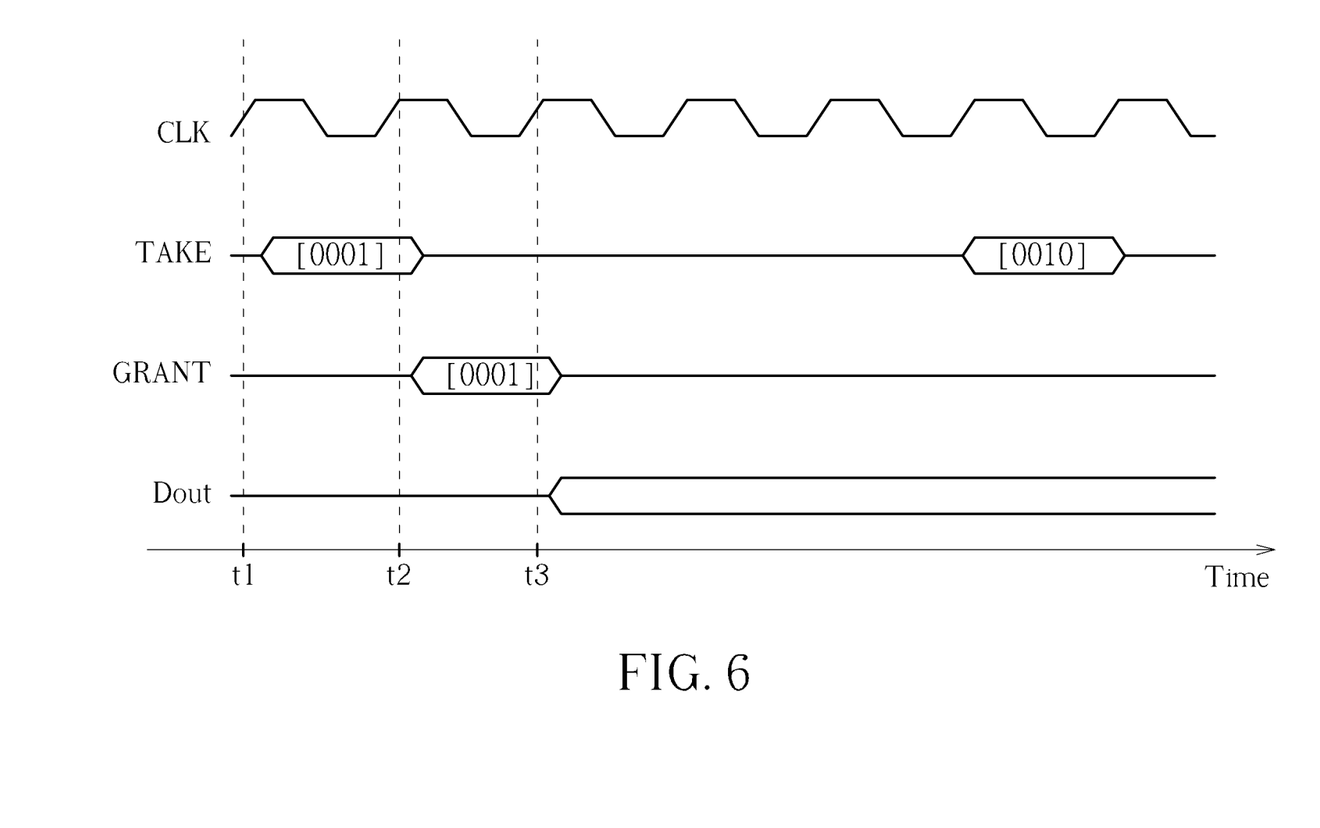
FIG. 6 is a timing diagram illustrating the operation of reading a channel data according to an embodiment of the present invention.

FIG. 6 is a timing diagram illustrating the operation of reading a channel data according to an embodiment of the present invention. An example of reading the first channel data D1 of the first channel 110a is illustrated. FIG. 6 comprises a clock signal CLK, a requesting signal TAKE, a granting signal GRANT and the channel data Dout. In this embodiment, it is assumed that the predetermined digital number [0001] corresponding to the first channel 110a is already stored in the storing circuit 104a. Hence, when a host sends a requesting signal TAKE to the channel controlling device 100 at t1 to read the first channel data D1 of the first channel 110a, the arbitration circuit 106 in the channel controlling device 100 will check whether the predetermined digital number [0001] is stored in the storing circuit 104a. When the arbitration circuit 106 detects that the predetermined digital number [0001] is stored in the storing circuit 104a, the arbitration circuit 106 will send the granting signal GRANT to the host at the next period (i.e. t2). After the host receives the granting signal GRANT, at the next period (i.e. t3), the arbitration circuit 106 controls the multiplexing circuit 102 to output the first channel data D1 of first channel 110a as the channel data Dout. When a host sends the requesting signal TAKE to the channel controlling device 100 to read the data of the channel having the highest priority, the channel controlling device 100 will output the correct channel data Dout in the third period at the earliest after receiving the requesting signal TAKE. The channel controlling device 100 of the present invention is thereby provided with a fast channel selection speed.

Through utilizing the sorting circuit 104 of the present invention, the channel controlling device 100 may output data of multiple channels according to a predetermined data output order, and may instantly adjust the predetermined data output order to make the channel controlling device 100 have a faster channel selection speed and higher data reading efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A channel controlling device, comprising:
a multiplexing circuit, coupled to multiple channels and arranged to refer to a selection signal to select a particular channel from the channels to output a channel data selection signal, wherein the channels are corresponding to multiple predetermined digital numbers, respectively;
a sorting circuit, arranged to refer to a data output order of the channels to sort the predetermined digital numbers, in order to convert the predetermined digital numbers into multiple sorted digital numbers; and
an arbitration circuit, arranged to refer to the sorted digital numbers to determine the selection signal.
2. The channel controlling device of claim 1, wherein the arbitration circuit refers to a predetermined digital number within the sorted digital numbers that has a highest priority to generate the selection signal.
3. The channel controlling device of claim 1, wherein the sorting circuit comprises:
multiple storing circuits, arranged to write the predetermined digital numbers according to the data output order of the channels, in order to form the sorted digital numbers.
4. The channel controlling device of claim 3, wherein the number of the channels is equal to the number of the storing circuits.
5. The channel controlling device of claim 3, wherein the storing circuits at least comprise:
a first storing circuit, arranged to write a first predetermined digital number corresponding to a first channel that has a higher data output order; and
a second storing circuit, arranged to write a second predetermined digital number corresponding to a second channel that has a lower data output order;
wherein the arbitration circuit uses the first predetermined digital number to generate the selection signal in advance, to make the first channel output the channel data.
6. The channel controlling device of claim 5, wherein after the first channel outputs the channel data, the first predetermined digital number in the first storing circuit is set to zero; and after the first predetermined digital number in the first storing circuit is set to zero, the second predetermined digital number previously stored in the second storing circuit is written to the first storing circuit.
7. The channel controlling device of claim 6, wherein after the second predetermined digital number previously stored in the second storing circuit is written to the first storing circuit, the arbitration circuit utilizes the second predetermined digital number in the first storing circuit to generate the selecting signal, to make the second channel output the channel data.

8. The channel controlling device of claim 6, wherein after the second predetermined digital number previously stored in the second storing circuit is written to the first storing circuit, the second predetermined digital number in the second storing circuit is set to zero.

9. The channel controlling device of claim 8, wherein the storing circuits further comprise:
   a third storing circuit, arranged to write a third predetermined digital number corresponding to a third channel that has a higher data output order;
   wherein after the second predetermined digital number in the second storing circuit is set to zero, the third predetermined digital number previously stored in the third storing circuit is written to the second storing circuit.

10. The channel controlling device of claim 3, wherein when a first predetermined digital number within the storing circuits stored by first storing circuit is required to be reset, the first predetermined digital number stored in the first storing circuit is set to zero in advance.

11. The channel controlling device of claim 10, wherein after the first predetermined digital number that is stored in the first storing circuit is set to zero, a second predetermined digital number that is previously stored in a second storing circuit within the storing circuits is written to the first storing circuit, and the second predetermined digital number in the second storing circuit is set to zero.

12. The channel controlling device of claim 11, wherein a data output order that corresponds to the first storing circuit is higher than a data output order that corresponds to the second storing circuit.

13. The channel controlling device of claim 3, wherein when a first predetermined digital number and a second predetermined digital number respectively stored in a first storing circuit and a second storing circuit within the storing circuits are required to be reset, the first predetermined digital number and the second predetermined digital number respectively stored in the first storing circuit and the second storing circuit are set to zero in advance.

14. The channel controlling device of claim 13, wherein after the first predetermined digital number and the second predetermined digital number respectively stored in the first storing circuit and the second storing circuit are set to zero, a third predetermined digital number previously stored in a third storing circuit within the storing circuits is written to the second storing circuit, and the third predetermined digital number in the third storing circuit is set to zero.

15. The channel controlling device of claim 14, wherein after the third predetermined digital number previously stored in the third storing circuit is written to the second storing circuit, and the third predetermined digital number in the third storing circuit is set to zero, the third predetermined digital number stored in the first storing circuit is set to zero, and the third predetermined digital number in the second storing circuit is set to zero.

16. The channel controlling device of claim 15, wherein a data output order corresponding to the first storing circuit is higher than a data output order corresponding to the second storing circuit, and the data output order corresponding to the second storing circuit is higher than a data output order corresponding to the third storing circuit.

17. The channel controlling device of claim 3, wherein each predetermined digital number within the predetermined digital numbers comprises multiple bit values, and each storing circuit within the storing circuits comprises multiple storage units arranged to store the bit values.

18. The channel controlling device of claim 17, wherein among the bit values, only one bit value is 1, and the remaining bit values are 0.

19. The channel controlling device of claim 17, wherein the storage units are controlled by multiple eliminating signals, wherein the eliminating signals are arranged to set one or more bits within the storage units to zero.

* * * * *